United States Patent
Kinoshita et al.

(10) Patent No.: US 9,748,410 B2
(45) Date of Patent: Aug. 29, 2017

(54) N-TYPE ALUMINUM NITRIDE SINGLE-CRYSTAL SUBSTRATE AND VERTICAL NITRIDE SEMICONDUCTOR DEVICE

(71) Applicant: Tokuyama Corporation, Yamaguchi (JP)

(72) Inventors: Toru Kinoshita, Yamaguchi (JP); Toshiyuki Obata, Yamaguchi (JP); Toru Nagashima, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 0 days.

(21) Appl. No.: 15/028,033

(22) PCT Filed: Oct. 15, 2014

(86) PCT No.: PCT/JP2014/077442
§ 371 (c)(1),
(2) Date: Apr. 8, 2016

(87) PCT Pub. No.: WO2015/056714
PCT Pub. Date: Apr. 23, 2015

(65) Prior Publication Data
US 2016/0254391 A1   Sep. 1, 2016

(30) Foreign Application Priority Data
Oct. 15, 2013 (JP) .................. 2013-214435

(51) Int. Cl.
*H01L 29/00* (2006.01)
*H01L 29/872* (2006.01)
(Continued)

(52) U.S. Cl.
CPC ............ *H01L 29/872* (2013.01); *C30B 25/20* (2013.01); *C30B 29/403* (2013.01);
(Continued)

(58) Field of Classification Search
CPC .......... H01L 21/02389; H01L 21/0254; H01L 21/02576; H01L 21/02598; H01L 21/0262;
(Continued)

(56) References Cited

U.S. PATENT DOCUMENTS 7,498,645 B2 * 3/2009 Li ................. H01L 31/0304
  257/431
7,638,346 B2 * 12/2009 Schowalter ...... H01L 21/02389
  117/104
(Continued)

FOREIGN PATENT DOCUMENTS

JP   2000091234 A   3/2000
JP   2003086816 A   3/2003
(Continued)

OTHER PUBLICATIONS

Taniyasu et al., "Intentional control of n-type conduction for Si-doped AlxGa1-xN (0.43 ≤ x < 1)", 2002, Applied Physics Letters, vol. 81, No. 7, pp. 1255-1277, published Aug. 12, 2012.*
(Continued)

*Primary Examiner* — Nikolay Yushin
(74) *Attorney, Agent, or Firm* — Cahn & Samuels, LLP

(57) ABSTRACT

A vertical nitride semiconductor device includes an n-type aluminum nitride single-crystal substrate having an Si content of $3 \times 10^{17}$ to $1 \times 10^{20}$ cm$^{-3}$ and a dislocation density of $10^6$ cm$^{-2}$ or less. An ohmic electrode layer is formed on an N-polarity side of the n-type aluminum nitride single-crystal substrate.

8 Claims, 5 Drawing Sheets

(51) Int. Cl.
*H01L 29/47* (2006.01)
*H01L 29/36* (2006.01)
*H01L 29/66* (2006.01)
*H01L 29/20* (2006.01)
*H01L 29/207* (2006.01)
*H01L 21/02* (2006.01)
*C30B 25/20* (2006.01)
*C30B 29/40* (2006.01)
*H01L 29/32* (2006.01)
*H01L 29/04* (2006.01)
*H01L 29/205* (2006.01)

(52) U.S. Cl.
CPC ...... *H01L 21/0254* (2013.01); *H01L 21/0262* (2013.01); *H01L 21/02389* (2013.01); *H01L 21/02576* (2013.01); *H01L 21/02598* (2013.01); *H01L 29/04* (2013.01); *H01L 29/2003* (2013.01); *H01L 29/205* (2013.01); *H01L 29/207* (2013.01); *H01L 29/32* (2013.01); *H01L 29/36* (2013.01); *H01L 29/47* (2013.01); *H01L 29/66143* (2013.01)

(58) Field of Classification Search
CPC ... H01L 21/0245; H01L 29/205; H01L 29/47; H01L 29/872; H01L 29/36; H01L 29/66143; H01L 29/2003; H01L 29/207; H01L 29/32; H01L 29/04; C30B 29/403; C30B 29/04403; C30B 29/40; C30B 25/20; C30B 25/00; C30B 25/16
See application file for complete search history.

(56) References Cited

U.S. PATENT DOCUMENTS

| | | | |
|---|---|---|---|
| 7,645,340 B2 | 1/2010 | Koukitu et al. | |
| 7,751,455 B2 * | 7/2010 | Kneissl | B82Y 20/00 372/43.01 |
| 8,129,208 B2 * | 3/2012 | Koukitu | C30B 25/02 257/E21.108 |
| 8,865,591 B2 | 10/2014 | Tamari et al. | |
| 2009/0280354 A1 | 11/2009 | Mizuhara et al. | |
| 2010/0147211 A1 | 6/2010 | Miyanaga et al. | |
| 2010/0164070 A1 | 7/2010 | Okahisa et al. | |
| 2010/0307405 A1 | 12/2010 | Miyanaga et al. | |
| 2010/0320462 A1 | 12/2010 | Koukitu et al. | |
| 2011/0018104 A1 * | 1/2011 | Nagashima | C30B 25/183 257/615 |
| 2012/0211801 A1 * | 8/2012 | Hashimoto | H01L 29/7785 257/194 |
| 2014/0264714 A1 * | 9/2014 | Moody | H01L 29/872 257/472 |

FOREIGN PATENT DOCUMENTS

| | | | |
|---|---|---|---|
| JP | 2003168820 A | 6/2003 | |
| JP | 2003273398 A | 9/2003 | |
| JP | 2003303774 A | 10/2003 | |
| JP | 2004165812 A | 6/2004 | |
| JP | 2006100801 A | 4/2006 | |
| JP | 2008013390 A | 1/2008 | |
| JP | 2009059912 A | 3/2009 | |
| JP | 2009126722 A | 6/2009 | |
| JP | 2009179533 A | 8/2009 | |
| JP | 2010089971 A | 4/2010 | |
| JP | 2011097065 A | 5/2011 | |
| JP | 5234968 B2 | 7/2013 | |
| JP | 2013212963 A | 10/2013 | |
| JP | 5670349 B2 | 2/2015 | |
| WO | 2007111219 A1 | 10/2007 | |
| WO | 2008096844 A1 | 8/2008 | |

OTHER PUBLICATIONS

Irmscher et al., "Compensating defects in Si-doped AlN bulk crystals", 2007, Physica B vol. 401-402, pp. 323-328 (Dec. 15, 2007).*
International Preliminary Report on Patentability PCT/JP2014/077442 , dated Apr. 29, 2016.
Enlgish Abstact of JP 2003086816.
English Abstract of JP 2006100801.
English Abstract of JP 2009059912.
English Abstract of JP 2000091234.
English Abstract of JP 2003273398.
English Abstract of JP 5234968.
English Abstract of JP 2011097065.
English Abstract of JP 2013212963.
English Abstract of JP 2009126722.
English Abstract of WO 2007111219.
English Abstract of WO 2008096844.
Reddy et al., "The effect of polarity and surface states on the Ferml level at III-nitride surfaces", Journal of Applied Physics 116, 123701 (2014).
English Abstract of JP 5670349.
English Abstract of JP 2010089971.
English Abstract of JP 2003303774.
English Abstract of JP 2004165812.
English Abstract of JP 2003168820.

* cited by examiner

N-TYPE ALUMINUM NITRIDE SINGLE-CRYSTAL SUBSTRATE AND VERTICAL NITRIDE SEMICONDUCTOR DEVICE

This application is a U.S. national stage application of PCT/JP2014/077442 filed on 15 Oct. 2014 and claims priority to Japanese patent document 2013-214435 filed on 15 Oct. 2013, the entireties of which are incorporated herein by reference.

TECHNICAL FIELD

The present invention relates to the n-type conductive single crystal aluminum nitride substrate (the n-type aluminum nitride single crystal substrate) doped with Si, and a vertical nitride semiconductor device using the substrate thereof.

BACKGROUND OF THE INVENTION

The aluminum nitride has the excellent characteristics such as about twice as larger bandgap (6.2 eV) compared to gallium nitride or silicon carbide which is known as the wide bandgap semiconductor, high dielectric breakdown voltage (12 MV/cm), and high thermal conductivity (3.0 Wcm$^{-1}$K$^{-1}$), and it is expected as a material capable of realizing a power device having even higher withstand voltage characteristic than the case of using the above mentioned materials.

As the device structure for realizing high performances (a high capacity and a high withstand voltage), in case of using the device using gallium nitride and silicon carbide, the vertical semiconductor device structure wherein the conductive substrate is used as the supporting substrate, in which the current flows or the voltage is applied to between the surface of the element and the backside, is proposed (see the patent documents 1 to 3).

By employing the vertical structure, the withstand voltage characteristic can be improved which was the object for the device of the horizontal type that is for the device wherein the current flow for driving the device runs in the horizontal direction. Further, by employing the vertical type structure, a larger electric power can be applied to the device. In order to realize the vertical type device structure, as mentioned in the above, it is necessary to use the conductive substrate. In regards with the conductive aluminum nitride, the method of forming the n-type conductive crystal layer doped with Si by a metalorganic vapor phase epitaxy (MOVPE) or a hydride vapor phase epitaxy (HVPE) or so is known (Patent documents 4 and 5).

However, in the patent documents 4 and 5, the n-type aluminum nitride single crystal layer is formed on the foreign substrate such as SiC substrate; hence it was difficult to produce a single crystal layer with high crystalline quality. Particularly, there was a room for improvement to produce the high crystalline quality and thick n-type aluminum nitride single crystal layer.

In order to solve above mentioned problems, the method of growing the n-type aluminum nitride single crystal layer on the base substrate made of the same material that is of the aluminum nitride single crystal layer has been developed (See the patent document 6).

[Patent Article 1] JP Patent Application Laid Open No. 2003-086816
[Patent Article 2] JP Patent Application Laid Open No. 2006-100801
[Patent Article 3] JP Patent Application Laid Open No. 2009-059912
[Patent Article 4] JP Patent Application Laid Open No. 2000-091234
[Patent Article 5] JP Patent Application Laid Open No. 2003-273398
[Patent Article 6] JP Patent No. 5234968

According to the method disclosed in the patent document 6, after the aluminum nitride freestanding substrate having a threading dislocation density of $10^5$ cm$^{-2}$ or so by the method disclosed in JP Patent Application Laid Open No. 2005-2552248 is produced, the n-type aluminum nitride single crystal layer can be formed on the aluminum nitride freestanding substrate. Then, according to this method, the n-type aluminum nitride single crystal layer having the dislocation density of $5\times10^9$ cm$^{-2}$ or so can be obtained.

However, the method of the patent document 6 has only produced a thin n-type aluminum nitride single crystal layer having the layer thickness of 10 μm or less, and there is no specific example of forming the electrodes. That is, the conventional art has still not realized the vertical semiconductor device with the thickness so that the n-type layer can be used as the freestanding substrate, and using the high quality aluminum nitride single crystal with n-type conductivity.

The present invention is attained in view of such situation, and the object is to provide the vertical semiconductor device using the n-type aluminum nitride single crystal substrate doped with Si.

SUMMARY OF THE INVENTION

The present inventors have produced the n-type single crystal aluminum nitride substrate according to the method disclosed in the patent document 6, and verified various characteristics by actually forming the electrodes. Then, the present inventors have found that in said n-type aluminum nitride single crystal substrate, the withstand voltage of the reverse direction was significantly low in some cases, and found that this was caused by the dislocation density of the n-type aluminum nitride single crystal layer. As a result, in order to produce the high performance device, the present inventors have found that the high quality n-type single crystal aluminum nitride single crystal substrate having further lower dislocation density is necessary; thereby the present invention was attained.

That is, the first invention is,
the n-type aluminum nitride single crystal substrate wherein a Si content is $3\times10^{17}$ to $1\times10^{20}$ cm$^{-3}$, a dislocation density is $10^6$ cm$^{-2}$ or less, and a thickness is 50 to 500 μm.

Also, the second invention is the vertical nitride semiconductor device comprising the electrode layers on the top and bottom principal planes of said n-type aluminum nitride single crystal substrate. In this vertical nitride semiconductor device, preferably electrode layer on one of the principal planes is an ohmic electrode layer. Also, by providing an ohmic electrode layer to one of the principal plane of the n-type aluminum nitride single crystal substrate, and a Schottky electrode layer to other principal plane, this vertical nitride semiconductor device can be suitably used as the vertical Schotkky barrier diode.

The third invention is a laminated body stacked with a layer represented by $Al_xGa_{1-x}N$ (note that, X is a rational number satisfying $0.3\leq X\leq 0.8$) having a Si content of $1\times10^{18}$ to $5\times10^{19}$ cm$^{-3}$, on at least one of the principal planes of the n-type aluminum nitride single crystal substrate.

Further, the fourth invention is the vertical nitride semiconductor device comprising the electrode layers on the top and the bottom principal planes of said layered body. In this vertical nitride semiconductor device, the electrode layer on the layer represented by $Al_xGa_{1-x}N$ (note that, X is a rational number satisfying $0.3 \leq X \leq 0.8$) is preferably an ohmic electrode layer. Also, by forming the electrode layer on the n-type aluminum nitride single crystal substrate as the Schottky barrier electrode layer, this vertical nitride semiconductor device can be suitably used as the vertical Schottky barrier diode.

The fifth invention is characterized by using the nitride aluminum single crystal seed substrate having the dislocation density of $10^4$ $cm^{-2}$ or less to produce said n-type aluminum nitride single crystal substrate.

According to said first invention, the vertical nitride semiconductor device using the n-type aluminum nitride single crystal substrate is provided and high withstand voltage characteristic can be realized by reducing the dislocation density of the n-type aluminum nitride single crystal substrate to $10^6$ $cm^{-2}$ or less, which have not been achieved by the conventional art.

DETAILED DESCRIPTION OF THE INVENTION

In the present invention, the vertical nitride semiconductor device has a structure wherein the working electrodes are formed on the top and the bottom planes of the n-type aluminum nitride single crystal substrate, and it can be suitably used for various semiconductor devices such as Schottky barrier diode, transistor, light emitting diode and laser diode or so within the range which does not exceed the scope of the present invention.

The vertical nitride semiconductor device of the present invention is the vertical nitride semiconductor device comprising the electrode layers on the top and the bottom surface of the n-type aluminum nitride single crystal substrate. Further, it is characterized by a specific range of Si content, a dislocation density and a thickness of said n-type aluminum nitride single crystal substrate.

In the present invention, the n-type aluminum nitride single crystal substrate may be a single layer having constant Si content, or may be plurality of layers having different Si content. Also, it may comprise the aluminum nitride single crystal layer wherein the Si content changes gradually. Next, the specific structure will be described using the figures.

(The Structure of the Vertical Nitride Semiconductor Device: The First Embodiment Example)

Figure 1:
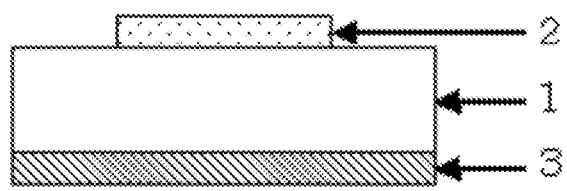
FIG. 1 is a schematic cross section showing one embodiment (the first embodiment example) of the vertical nitride device of the present invention.

First, the nitride aluminum single crystal layer wherein the single layer has constant Si content will be described, then the nitride aluminum single crystal layer wherein Si content gradually changes will be described. In FIG. 1, the vertical Schottky barrier diode structure is shown as a typical example.

As shown in FIG. 1, the vertical nitride semiconductor device comprises the n-type aluminum nitride single crystal substrate 1, and the working electrode layers 2 and 3 are formed on the top and the bottom planes ((the principal plane): not the side plane, but the plane where the electrodes are formed and the planes where other layer grows) of the n-type aluminum nitride single crystal substrate 1. In case the vertical nitride semiconductor device of the present invention is used as the vertical Schottky barrier diode, the electrode on one surface is the ohmic electrode layer 3, and the electrode on other surface is the Schottky electrode layer 2. Next, each constituting member will be described.

(The n-Type Aluminum Nitride Single Crystal Substrate)

The n-type aluminum nitride single crystal substrate 1 has the dislocation density of $10^6$ $cm^{-2}$ or less, and containing Si within the range of $3 \times 10^{17}$ to $1 \times 10^{20}$ $cm^{-3}$. Note that, this dislocation density refers to the dislocation density of the outer most plane of the n-type aluminum nitride single crystal substrate.

The dislocation in the n-type aluminum nitride single crystal substrate acts the leak source of the current when the vertical device is running, which could be a cause to deteriorate the initial withstand voltage characteristic, and also in case of using it for long period of time, the diffusion of the impurities may be promoted via the dislocation, thereby the device characteristic gradually deteriorates. Also, the dislocation causes the scattering of the electrons which is the n-type conductive carrier. Further, the mobility of electrons decreases when many dislocations are present in the n-type aluminum nitride single crystal substrate, as a result the n-type conductive characteristic tends to decline. In order to suppress the decline of such device characteristic and n-type conductive characteristic, the dislocation density in the n-type aluminum nitride single crystal substrate is $10^6$ $cm^{-2}$ or less, and more preferably $10^4$ $cm^{-3}$ or less. The preferable lower limit of the dislocation density is 0 $cm^{-2}$, however from the point of the industrial productivity, it is $10^2$ $cm^{-2}$. The measurement of the dislocation density can be carried out by observation of transmission electron microscope (TEM) image, or simply by observation of the etch pit density of after being immersed in the alkaline solution. Note that, in the present invention, the etch pit density was set as the dislocation density.

Also Si content included in the n-type aluminum nitride single crystal substrate 1 is $3 \times 10^{17}$ to $1 \times 10^{20}$ $cm^{-3}$. In case Si content is less than $3 \times 10^{17}$ $cm^{-3}$, the conductivity declines because the n-type conductive carrier concentration decreases, and thus the resistance value of the device increases thus it is not preferable. On the other hand, when it is $1 \times 10^{20}$ $cm^{-3}$ or more, risks of causing problems such as generation of cracks, and increase of the impurity concentration other than Si such as oxygen or so along with the roughening of the growth surface or so rises, thus it is not preferable. Note that, as mentioned in above, when Si content is within said range, certain amount may be included in the n-type aluminum nitride single crystal substrate. Also, as long as the upper limit and lower limit of Si content is within said range, the Si content may vary within the range between the upper limit and the lower limit.

For this Si content, the optimum value may be determined within said range so that the desired n-type conductive characteristic can be exhibited accordingly. For example, in case high conductive characteristic is demanded, the Si content is preferably $1 \times 10^{18}$ to $8 \times 10^{19}$ cm$^{-3}$, and more preferably $5 \times 10^{18}$ to $5 \times 10^{19}$ cm$^{-3}$.

Also, since carbon is an acceptor impurity, it can cause the n-type conductivity to decline by compensating Si. Therefore, in order to obtain n-type conductivity, the carbon concentration needs to be suppressed lower than Si content. The concentration of acceptor impurity (carbon) included in the n-type aluminum nitride single crystal substrate 1 is preferably $2 \times 10^{17}$ cm$^{-3}$ or less, and more preferably $1 \times 10^{17}$ cm$^{-3}$ or less. The lower limit of the preferable range of the acceptor impurity concentration is 0 cm$^{-3}$; however it is $1 \times 10^{15}$ cm$^{-3}$ or so considering the detection lower limit of the known analysis method which will be described in below.

Note that, the measurement of Si content and the acceptor impurity (carbon) can be carried out by known technology such as the secondary ion mass spectroscopy (SIMS) or so. Also, the n-type conductivity can be measured by known hall effect measurement, CV measurement or so.

The thickness of the n-type aluminum nitride single crystal substrate 1 is within the range of 50 to 500 μm and it may be determined accordingly within the above mentioned range depending on the desired purpose of use or design. When the thickness of the substrate is below the above mentioned lower limit, it becomes difficult to ensure the freestanding property as the substrate, and further it may become the cause of the crack during the device production process, which causes the decrease of the production yield hence it is not preferable. On the other hand, when the thickness of the substrate exceeds the above mentioned range, in addition to the decline of the productivity due to the production time of the n-type aluminum nitride substrate described in below, it may become the cause of the increase of the resistance value in the vertical direction for the characteristic plane of the device.

Note that, the plane orientation of the principal planes (the plane which is not the side plane but the plane where the electrode layers or other layer is formed on the layer) of the n-type aluminum nitride single crystal substrate 1 are C-plane (the Al polarity plane) and −C-plane (the N polarity plane). Also, as other identification of the n-type aluminum nitride single crystal substrate 1, the full widths half maximum values of X ray rocking curve measurement for (002) and (101) reflection are preferably 100 seconds or less.

(The Electrode Layers)

In the present invention, the electrode layers may be determined accordingly depending on the purpose of use. For example, in case of using the vertical nitride semiconductor device of the present invention for the vertical transistor, the gate electrode, the source electrode, the drain electrode or so may be formed on the both principal planes of said n-type aluminum nitride single crystal substrate. Also, in case of using the vertical nitride semiconductor device of the present invention for the light emitting diode, the n-type ohmic electrode layer is formed on the n-type aluminum nitride single crystal substrate, and p-type ohmic electrode layer is formed on other plane. Particularly, in case of using the vertical nitride semiconductor device of the present invention as the Schottky barrier diode, the ohmic electrode layer and the Schottky electrode layer are preferably formed.

(The Ohmic Electrode Layer of the First Embodiment Example)

Next, the ohmic electrode layer 3 will be described. For this ohmic electrode layer 3, the known ohmic electrode material can be used. Specifically, as long as it is a material which can reduce the contact resistance value against the n-type aluminum nitride single crystal substrate, it is not particularly limited, and for example the electrode material including Ti and Al as disclosed in JP Patent Application Laid Open No. 2011-547604 is preferably used. In order to reduce the contact resistance value, it is preferable that these electrode materials are annealed under the inactive gas atmosphere such as argon or nitrogen after the electrode is formed. The anneal temperature is not particularly limited; however it is preferably between 700 to 1100° C. Also, the thickness of the ohmic electrode layer 3 is not particularly limited, and the thickness of each layer may be determined accordingly within the range capable of reducing the contact resistance value after the annealing; however considering the productivity of the electrode layer, the total thickness is preferably within 50 to 500 nm.

Also, the plane orientation of the n-type aluminum nitride single crystal substrate surface, to which the ohmic electrode layer is formed, is not particularly limited, and it may be determined accordingly depending on the device structure. Among these, in case of using for the vertical Schottky barrier diode which is described as in the first embodiment example, it is preferably C-plane (the Al polarity plane).

(The Schottky Barrier Electrode Layer of the First Embodiment Example)

The vertical nitride semiconductor device of the present invention is preferable that the Schottky electrode layer 2 is formed on the n-type aluminum nitride single crystal substrate 1.

The material of the Schottky electrode layer 2 is not particularly limited as long as it is the material which forms the Schottky barrier for the n-type aluminum nitride single crystal substrate, and for example the material having relatively large work function such as Ni, Pt, Pd, Au or so can be used. Further, it may be a single layer made of these materials, or it may be plurality of layers. Also, the thickness is not particularly limited; however in general, it is within the range of 10 to 500 nm.

Also, the plane orientation of the n-type aluminum nitride single crystal substrate surface, to which the Schottky electrode layer 2 is formed, is preferably the opposite of the plane orientation to which the above mentioned ohmic electrode layer 3 is formed, that is it is preferably −C-plane (the N polarity plane).

By making the vertical nitride semiconductor device of the embodiment as discussed in the above, the vertical nitride semiconductor device which exhibits an excellent performances such as the electric current flow of $10^{-6}$ cm$^{-2}$ or less at the reverse voltage of 100 V can be produced.

Figure 2:
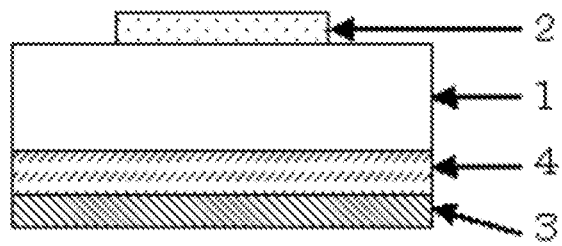
FIG. 2 is a schematic cross section showing one embodiment (the second embodiment example) of the vertical nitride device of the present invention.

Next, the embodiment shown in FIG. 2, that is the laminated body of the present invention, and the vertical nitride semiconductor device formed with the electrode layer on said laminated body will be described.

(The Structure of the Vertical Nitride Semiconductor Device: The Second Embodiment Example)

As the second embodiment, the laminated body that comprises the n-type $Al_xGa_{1-x}N$ layer 4 with Si formed on the n-type aluminum nitride single crystal substrate. This n-type $Al_xGa_{1-x}N$ layer 4 is not particularly limited, however, as shown in FIG. 2, preferably the n-type $Al_xGa_{1-x}N$ layer 4 with Si which is formed between the n-type aluminum nitride single crystal substrate 1 and the ohmic electrode layer 3. Note that, in the second embodiment example, the n-type aluminum nitride single crystal substrate 1, the ohmic electrode layer 3, and the Schottky electrode layer 2 are the same as the substrate and layers as described in the first embodiment example.

(The Laminated Body)

In the present invention, the laminated body is laminated with n-type $Al_xGa_{1-x}N$ layer on at least one principal plane of said n-type aluminum nitride single crystal substrate. Among these, the n-type $Al_xGa_{1-x}N$ layer is preferably formed on the Al polarity plane 1b side of said n-type aluminum nitride single crystal substrate.

The Si content of this n-type $Al_xGa_{1-x}N$ layer is preferably $1\times10^{18}$ to $5\times10^{19}$ $cm^{-3}$. The Si content is not particularly limited as long as it is within the range, however in order to further reduce the above mentioned contact resistance value, preferably it is $5\times10^{18}$ to $4\times10^{19}$ $cm^{-3}$, and more preferably $8\times10^{18}$ to $3\times10^{19}$ $cm^{-3}$.

The Al composition X of the n-type $Al_xGa_{1-x}N$ layer may be determined according to the type and the purpose of the semiconductor device, however it is preferably $0.3\leq X\leq 0.8$. For example, in case of applying to the Schottky barrier diode as shown in FIG. 2, the optimum composition may be determined in view of the contact resistance and the withstand voltage of the element; and preferably it is $0.4\leq X\leq 0.75$, and more preferably $0.5\leq X\leq 0.7$.

Also, the thickness of the n-type $Al_xGa_{1-x}N$ layer is not particularly limited as similar to the n-type aluminum nitride single crystal substrate, and it may be determined based on the desired purpose of use and the design. For example, to use n-type $Al_xGa_{1-x}N$ as the contact layer of the Schottky barrier diode, the thickness of n-type $Al_xGa_{1-x}N$ is preferably 20 to 500 nm.

Such laminated body wherein the n-type $Al_xGa_{1-x}N$ layer 4 is stacked on said n-type aluminum nitride single crystal substrate 1 may have the electrode layer on the surface of the n-type $Al_xGa_{1-x}N$ layer and on the surface of said n-type aluminum nitride single crystal substrate according to the desired purpose of use.

Particularly, to use the laminated body as the vertical Schottky barrier diode, the ohmic electrode layer 3 is formed on the n-type $Al_xGa_{1-x}N$ layer, and preferably on Al polarity plane of the n-type $Al_xGa_{1-x}N$ layer; and the Schottky electrode layer 2 is formed on the surface of the n-type aluminum nitride single crystal substrate and preferably on the N polarity plane 1a of the n-type aluminum nitride single crystal substrate 1. By forming the n-type $Al_xGa_{1-x}N$ layer 4 between the n-type aluminum nitride single crystal substrate 1 and the ohmic electrode layer 3, the n-type $Al_xGa_{1-x}N$ layer 4 acts as the contact layer against the ohmic electrode layer 3; therefore the contact resistance value between the ohmic electrode layer 3 and the crystal layer (the n-type $Al_xGa_{1-x}N$ layer 4 and the n-type aluminum nitride single crystal substrate 1) can be further reduced compared to the first embodiment example.

Note that, as these ohmic electrode layer 3 and the Schottky electrode layer 2, those described in the first embodiment example can be used as well.

(The Production Method of the Vertical Nitride Semiconductor Device)

Next, the production method of the vertical nitride semiconductor device will be described. The production method of the vertical nitride semiconductor device of the above mentioned first and second embodiment examples are not particularly limited. Particularly, it is preferable to employ the method of growing the n-type aluminum nitride single crystal layer with the Si content of $3\times10^{17}$ to $1\times10^{20}$ $cm^{-3}$ on the aluminum nitride single crystal seed substrate having the dislocation density of $10^4$ $cm^{-2}$ or less; then separating this n-type aluminum nitride single crystal layer thereby using as the n-type aluminum nitride single crystal substrate. That is, by using the aluminum nitride single crystal seed substrate having extremely low dislocation density (the dislocation density of $10^4$ $cm^{-2}$ or less), the n-type aluminum nitride single crystal substrate with the Si content of $3\times10^{17}$ to $1\times10^{20}$ $cm^{-3}$, and the dislocation density of $10^6$ $cm^{-2}$ or less can be obtained easily.

For the conventional method described as in the patent document 6, the aluminum nitride single crystal seed substrate with the dislocation density of $10^5$ $cm^{-2}$ or so was used and the n-type aluminum nitride single crystal layer was grown thereon; however in such case, the n-type aluminum nitride single crystal layer having the dislocation density of $5\times10^9$ $cm^{-2}$ was obtained at the best. In the present invention, the n-type aluminum nitride single crystal substrate having higher quality than the conventional ones is used. In order to obtain such n-type aluminum nitride single crystal substrate, the seed substrate for producing the n-type aluminum nitride single crystal layer (the substrate) becomes important. It is preferable to produce by the following method. It will be described in step wise.

(The Production Method of the Vertical Nitride Semiconductor Device of the First Embodiment Example)

Figure 3:
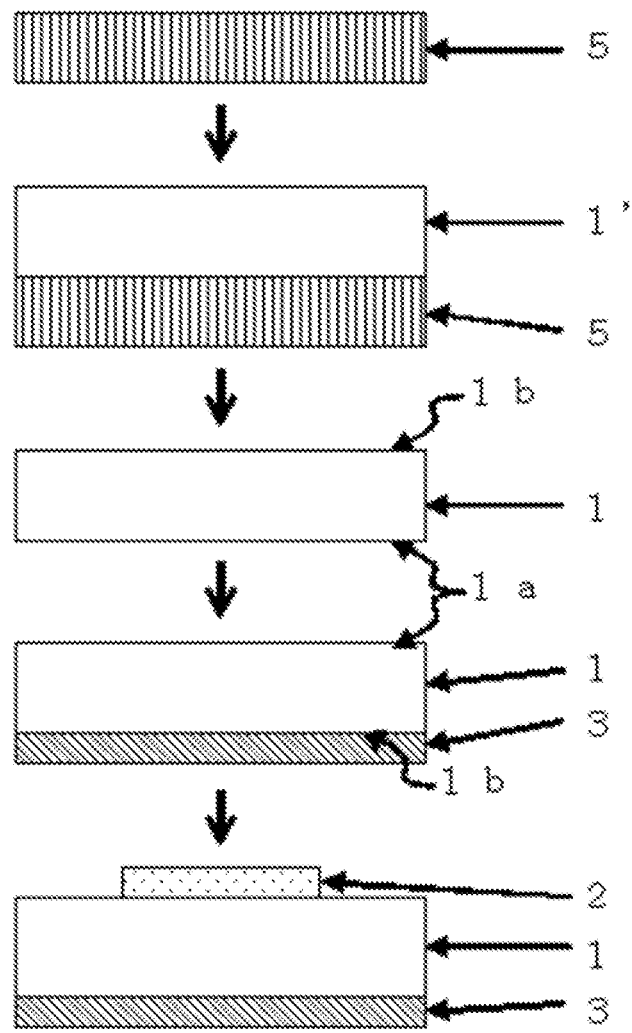
FIG. 3 is a schematic cross section showing one embodiment of the production process of the vertical nitride device (the first embodiment example) of the present invention.

An example of the production method of the vertical nitride semiconductor device of the first embodiment example will be explained using FIG. 3.

First, the aluminum nitride single crystal seed substrate 5 used for producing the n-type aluminum nitride single crystal substrate is prepared. This aluminum nitride single crystal substrate will be described first.

((The Preparation of) the Aluminum Nitride Single Crystal Seed Substrate)

After the n-type aluminum nitride single crystal layer 1' on the aluminum nitride single crystal seed substrate 5 is formed, the n-type aluminum nitride single crystal substrate 1 is obtained by separating the n-type aluminum nitride single crystal layer 1' and the aluminum nitride single crystal seed substrate 5.

The dislocation density of the aluminum nitride single crystal seed substrate 5 is preferably $10^4$ $cm^{-2}$ or less, and more preferably $10^3$ $cm^{-2}$ or less. In case the dislocation density exceeds $10^4$ $cm^{-2}$, when the n-type aluminum nitride single crystal layer 1' is formed on the aluminum nitride single crystal seed substrate 5, the stress cumulates in the n-type aluminum nitride single crystal layer, thus as the thickness of the layer of the n-type aluminum nitride single crystal layer 1' becomes thicker, the cracks tend to occur easier. Also, in case the dislocation density exceeds $10^4$ $cm^{-2}$, the dislocation density of the obtained n-type aluminum nitride single crystal layer 1' (the n-type aluminum nitride single crystal substrate 1) becomes difficult to be $10^6$ $cm^{-2}$ or less.

Note that, the lower limit of the dislocation density of the aluminum nitride single crystal seed substrate is 0 $cm^{-2}$, however from the point of the industrial productivity, it is preferably $10^2$ $cm^{-2}$. The measurement of the dislocation density can be carried out by observation of a transmittance electron microscope (TEM) images, or simply by observation of the etch pit density of after being immersed in the alkaline solution. Note that, in the present invention, the dislocation density is the etch pit density.

Such aluminum nitride single crystal seed substrate 5 with low dislocation density can be produced by known methods. Further, this method is not particularly limited as long as the above mentioned characteristics can be obtained; however a sublimation method (for example, as described in Journal of Crystal Growth. 312.2519), or the method proposed in JP Patent Application Laid Open No. 2010-89971 can be used.

In the aluminum nitride single crystal seed substrate 5, the main plane on which the n-type aluminum nitride single crystal layer 1' is formed is desirably C-plane (the Al polarity plane). Further, the surface roughness of the main plane is preferably smooth at the atomic layer level in order to prevent the lowering of the crystal quality of the n-type aluminum nitride single crystal layer. Specifically, in the entire plane of the main plane of the seed substrate, the surface roughness is preferably 0.2 nm or less in a root mean square (RMS) roughness. In case the surface roughness exceeds the above mentioned range, or when flaw due to the polishing exist on the main plane of the seed substrate, as same as in case of having high dislocation density, the cracks easily occur to the n-type aluminum nitride single crystal layer 1'.

Preferably, the plane orientation of the main plane on which the n-type aluminum nitride single crystal layer 1' is grown is C-plane. The inclination of the C-plane (the off angle) is not particularly limited, and it is preferably 0 to 3°.

Also, the thickness of the aluminum nitride single crystal seed substrate 5 is not particularly limited; however it is usually 0.3 to 1.0 mm or so. By preparing such seed substrate, the n-type aluminum nitride single crystal layer 1' having high crystalline quality can be formed.

Next, the growing method of the n-type aluminum nitride single crystal layer 1' which is grown on this aluminum nitride single crystal seed substrate 5 will be described.

(The Growing Method of the n-Type Aluminum Nitride Single Crystal Layer 1')

The growing method of the n-type aluminum nitride single crystal layer 1' which is grown on above mentioned aluminum nitride single crystal seed substrate 5 will be described. The n-type aluminum nitride single crystal layer 1' is produced by the known method such as HVPE, MOVPE, molecule beam epitaxy (MBE) or so. Particularly, from the point of productivity to obtain relatively high growth rate, HVPE or MOVPE are preferable, and HVPE is most preferable from the point of obtaining the highest growth rate.

In case of employing the HVPE, as disclosed in the JP Patent No. 3803788 or the JP Patent No. 3936277, halogenated aluminum and ammonia are supplied on the aluminum nitride single crystal seed substrate 5 together with the carrier gas such as hydrogen or nitrogen or so, thereby preferably the n-type aluminum nitride single crystal layer 1' is grown. The temperature of the seed substrate 5 for growing the n-type aluminum nitride single crystal layer 1' is preferably 1100 to 1800° C., more preferably 1250 to 1600° C., and most preferably 1400 to 1550° C. In general, in case of growing the n-type nitride semiconductor layer by doping Si, strains are cumulated in the Si doped layer during the growth, and it is known that the cracks or so occurs. However, by growing the n-type aluminum nitride single crystal layer at the high temperature such as mentioned in the above of 1100° C. or higher, preferably 1250° C. or higher, and particularly preferably 1400° C. or higher; even when the n-type aluminum nitride single crystal layer having the layer thickness of 50 μm or more is grown, the occurrence of the new dislocation and the cracks during the growth can be significantly reduced. Further, the molar ratio of the nitrogen atom and aluminum atom (V/III ratio) is preferably 0.5 to 100, and further preferably 2 to 20, although it depends on the crystal growth reactor used.

For the method of Si doping during the growth of the n-type aluminum nitride single crystal layer 1', as for example described in the JP Patent No. 5234968, it is preferable to use $SiH_\alpha Cl_{4-\alpha}$ ($\alpha$ is an integer of 0 to 3) as the Si source. In case the Si concentration is made constant in the thickness direction, the flow amount of $SiH_\alpha Cl_{4-\alpha}$ during the n-type aluminum nitride growth may be held constant.

Also, as other method for Si doping, the method of using decomposed Si which comes from the Si source material containing Si such as quartz and Si put on around the susceptor which heats the aluminum nitride single crystal seed substrate can be used. The Si content may be determined accordingly by adjusting the supplying amount of $SiH_\alpha Cl_{4-\alpha}$ gas and the amount of the Si source material.

In case of employing MOVPE, for example as disclosed in Applied Physics Letters. 85.4672, trimethyl aluminum and ammonia may be used as the source material of the aluminum nitride single crystal layer. As the Si source material, in addition to the silane gas disclosed in the above article, the known material such as tetraethyl silane or so can be used. Also, the growth temperature may be determined accordingly within the range capable of obtaining high crystalline quality by evaluating the characteristic of as grown n-type aluminum nitride single crystal layer by the X ray rocking curve; however it is usually 1100 to 1300° C. or so.

By employing the method mention in the above, the n-type aluminum nitride single crystal layer 1' with the Si content of $3\times10$ to $1\times10^{20}$ cm$^{-3}$ and the dislocation density of $10^6$ cm$^-$ or less can be grown on the aluminum nitride single crystal seed substrate 5. For the method of the present invention, the aluminum nitride single crystal seed substrate 5 with low dislocation density, specifically $10^4$ cm$^{-2}$ or less, is used, hence the n-type aluminum nitride single crystal layer 1' with high Si content and low dislocation density can be grown easily. The thickness of the n-type aluminum nitride single crystal layer 1' is not particularly limited; however it is made thicker than the desired n-type aluminum nitride single crystal substrate 1. Therefore, the n-type aluminum nitride single crystal layer 1' is preferably 50 to 600 μm.

Next, the n-type aluminum nitride single crystal layer 1' grown as described in the above and the aluminum nitride single crystal seed substrate 5 are separated; thereby the n-type aluminum nitride single crystal substrate 1 is made. The method regarding this step will be described.

(The Preparation of the n-Type Aluminum Nitride Single Crystal Substrate (the Production Method))

Next, the method of producing the laminated substrate with the n-type aluminum nitride single crystal layer 1' formed on the aluminum nitride single crystal seed substrate 5 according to the above mentioned method, and then separating the seed substrate 5 and the n-type aluminum nitride single crystal layer 1' will be described.

The separation method is not particularly limited, and the known techniques as shown in below as example can be used. For example, the method of producing the laminated substrate and then carrying out the mechanical polishing of the seed substrate portion, the method of dissolving only the seed substrate portion by immersing in the alkaline solution such as potassium hydroxide or so, the method of separating by irradiating the laser light as proposed in the JP Patent Application Laid Open No. 2003-168820 or so may be mentioned. Thereby, the freestanding n-type aluminum nitride single crystal substrate 1 can be obtained. The plane which the aluminum nitride single crystal seed substrate 5 has been separated according to the above mentioned method, and the opposite plane thereof (the growth surface) are preferably removed the damaged layer caused by the mechanical polish and/or surface oxidation of after the growth by carrying out the chemical-mechanical polishing (CMP), thereby the smoothness is improved. Note that, the order of carrying out CMP of the growth surface is not limited to after the separation, but it may be determined appropriately; for example it may be carried out after the growth of the n-type aluminum nitride single crystal layer 1'.

Note that, in case the growth plane of the aluminum nitride single crystal seed substrate 5 is C-plane, the plane which the aluminum nitride single crystal seed substrate 5 has been separated is the N polarity plane 1a and the opposite plane (the growth surface) thereof is the Al polarity plane 1b.

Next, for the n-type aluminum nitride single crystal substrate 1 obtained as such, the working electrodes are formed on both sides of the substrate. Here, the case of forming the ohmic electrode layer 3 on the Al polarity plane 1b, and forming the Schottky electrode layer 2 on the N polarity plane 1b will be described.

(The Formation Method of the Ohmic Electrode Layer and the Schottky Electrode Layer)

In case of producing the Schottky barrier diode using the n-type aluminum nitride single crystal substrate, it is preferable to form the ohmic electrode layer 3 on the Al polarity plane 1b of the n-type aluminum nitride single crystal substrate 1 according to the known film deposition methods such as a vacuum evaporation, a spattering or so. The n-type ohmic electrode layer 3 is formed by stacking the metal such as Ti or Al or so in a predetermined thickness and by the predetermined stacking order. After the ohmic electrode is formed, it is preferable that the ohmic electrode is annealed under the inactive gas atmosphere such as nitrogen, argon or so. Thereby, the contact resistance value between the ohmic electrode layer and n-type aluminum nitride single crystal (substrate) can be reduced. The thickness of each layer and the layer constitution are the same as the ohmic electrode layer of the first embodiment example.

Next, according to the same methods as the ohmic electrode 3, the Schottky electrode layer 4 such as Ni, Pt, Pd, Au or so is formed on the N polarity plane 1a. The thickness of each layer and the layer constitution of the Schottky electrode layer are the same as the Schottky electrode layer of the first embodiment example.

According to the method described in above, the first vertical nitride semiconductor device can be produced.

Next, the production method of the vertical nitride semiconductor device of the second embodiment will be described based on FIG. 4 to 5.

(The Production Method of the Vertical Nitride Semiconductor Device of the Second Embodiment Example)

Figure 4:
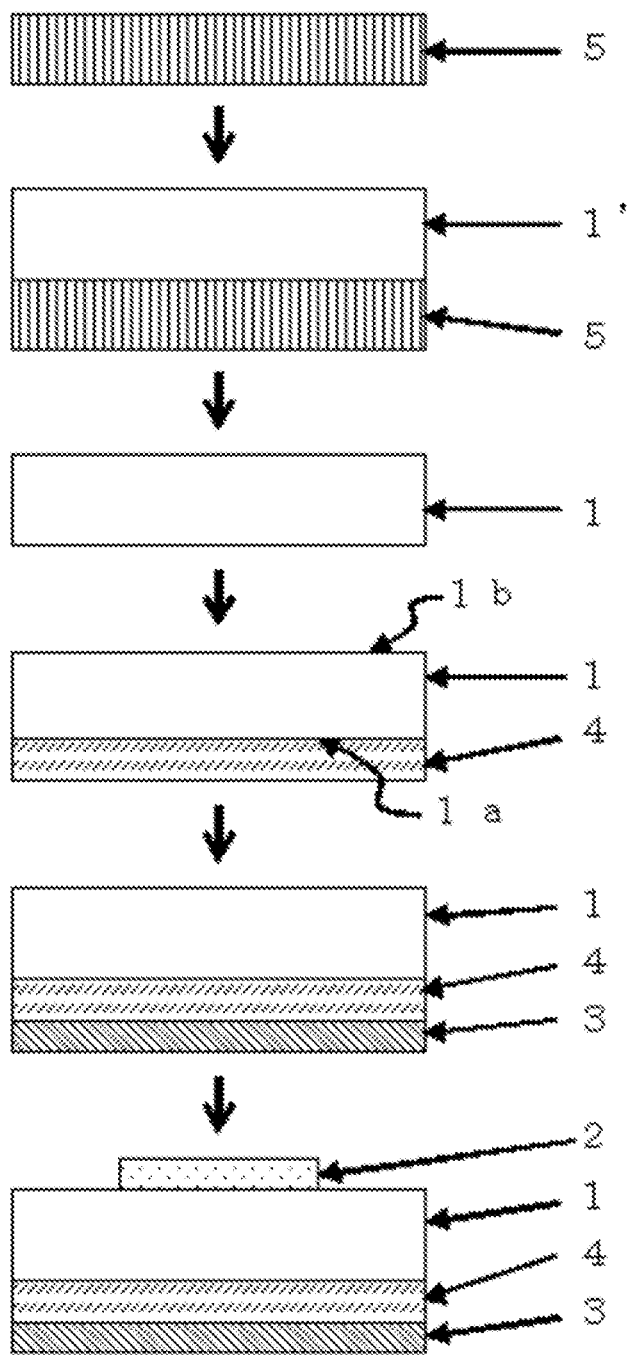
FIG. 4 is a schematic diagram showing one embodiment of the production process of the vertical nitride device (the second embodiment example) of the present invention.

In FIG. 4, the method of forming the n-type $Al_xGa_{1-x}N$ layer 4 on the N polarity plane of the n-type aluminum nitride single crystal layer 1 is shown. In such case, the production method is the same as that of the vertical nitride semiconductor device of the first embodiment example up until producing the n-type aluminum nitride single crystal substrate 1.

Next, on the N polarity plane 1a of the obtained n-type nitride single crystal substrate 1, the n-type $Al_xGa_{1-x}N$ layer 4 is grown.

(The Growth Condition of the n-Type $Al_xGa_{1-x}N$ Layer: The Production Method of the Layered Body)

The n-type $Al_xGa_{1-x}N$ layer can be formed by known crystal growth method such as HVPE, MOVPE or MBE or so; however from the point of easy control of the composition and the layer thickness, MOVPE is most preferable.

The n-type aluminum nitride single crystal substrate 1 is placed in the growth reactor, and the n-type $Al_xGa_{1-x}N$ layer 4 is formed under the growth condition shown in below as example. The plane orientation of the main plane of the n-type aluminum nitride single crystal substrate 1 which the n-type $Al_xGa_{1-x}N$ layer 4 is formed is the N polarity plane. Also, the polarity of the growth surface of the n-type $Al_xGa_{1-x}N$ layer 4 of after the growth may be the same as the substrate, or the polarity may be reversed. Particularly, when the n-type $Al_xGa_{1-x}N$ layer 4 is formed on the N polarity plane of the n-type aluminum nitride single crystal substrate 1, the polarity of the n-type $Al_xGa_{1-x}N$ layer 4 is reversed, and the polarity of the growth surface (the outer most surface of the n-type $Al_xGa_{1-x}N$ layer 4) is preferably the Al polarity plane.

In case of producing the n-type $Al_xGa_{1-x}N$ layer 4 by MOCVD, for example as disclosed in Applied Physics Letters. 81.1038, the n-type $Al_xGa_{1-x}N$ layer 4 can be formed by using trimethyl aluminum, trimethyl gallium, ammonia and silane as the source material. Also, as Si material, in addition to the silane gas disclosed in the above article, the known material such as tetraethyl silane or so can be used. Also, the growth temperature may be determined accordingly within the range capable of obtaining the desired conductivity characteristic of the n-type $Al_xGa_{1-x}N$ layer 4; however it is usually 1050 to 1100° C. or so.

After growing the n-type $Al_xGa_{1-x}N$ layer 4 as such, the ohmic electrode layer 3 is formed on the n-type $Al_xGa_{1-x}N$ layer 4 (preferably on Al polarity plane), and the Schottky electrode layer 2 is formed on the surface (preferably on the N polarity plane) of the n-type aluminum nitride single crystal substrate 1 side. As the method of forming these electrode layers, the same method as the method discussed in the method for forming the above mentioned ohmic electrode layer and the Schottky electrode layer can be employed.

Figure 5:
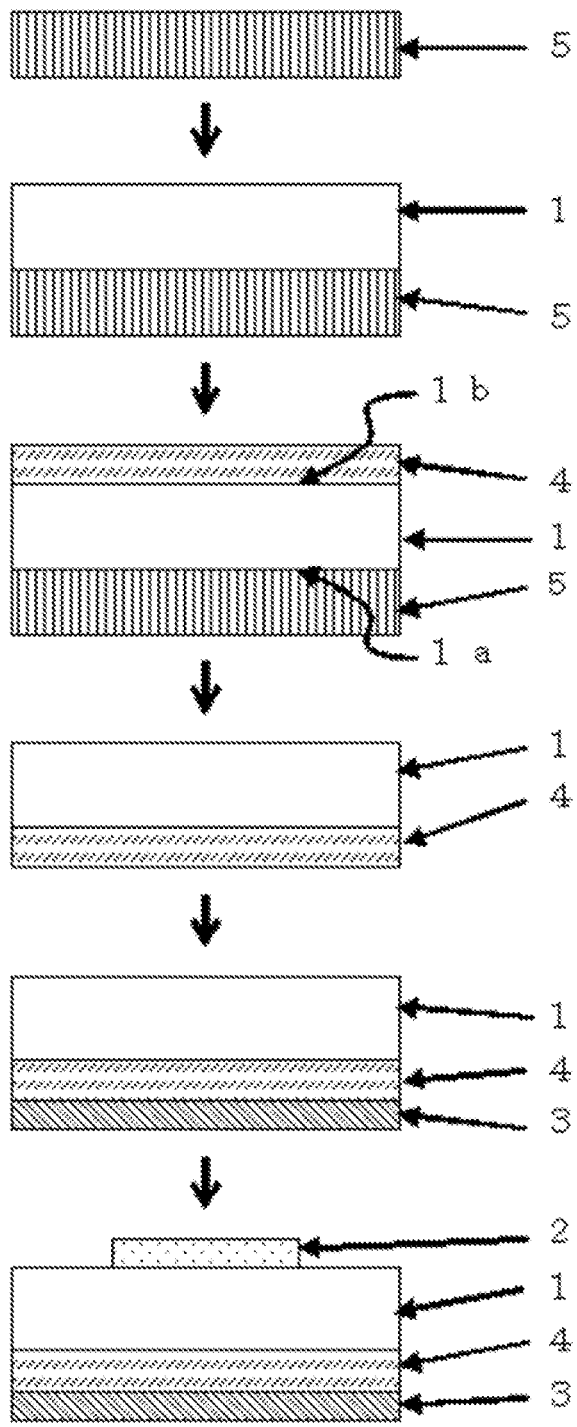
FIG. 5 is a schematic diagram showing other embodiment of the production process of the vertical nitride device (the second embodiment example) of the present invention.

Also, in FIG. 5, the method of growing the n-type $Al_xGa_{1-x}N$ layer 4 on the growth surface (on the Al polarity plane 1b) of the n-type aluminum nitride single crystal layer 1' is shown. In such case, for the separation of the n-type aluminum nitride single crystal substrate 1, the growth method of the n-type $Al_xGa_{1-x}N$ layer 4, the method of forming the ohmic electrode layer 3 and the Schottky electrode 2; the same methods discussed in the above can be employed. Also, in FIG. 5, the growth of n-type $Al_xGa_{1-x}N$ layer 4 is carried out before the separation of the n-type aluminum nitride single crystal substrate, however it can be carried out after the separation.

(The Use of the Vertical Nitride Semiconductor Device and the Others)

Hereinabove, the production method of the vertical Schottky barrier diode has been described, however the present invention is not limited thereto, and within the range which does not exceed the scope of the present invention, it may be applied to various devices such as vertical light emitting diode, bipolar transistor, unipolar transistor or so. For example, in case of producing the vertical transistor, depending on the needs, the n-type and p-type $Al_xGa_{1-y}N$ layers (note that, Y is a rational number satisfying $0.0 \leq Y \leq 1.0$) are stacked on the Al polar plane 1b side of the n-type aluminum nitride single crystal substrate, and then the source electrode, the gate electrode or so can be formed. The n-type and p-type $Al_xGa_{1-x}N$ layers are preferably grown by MOVPE, and the composition and the layer thickness or so of $Al_xGa_{1-x}N$ layers can be determined accordingly depending on the design of the transistor. Also, in this case, it is preferable to form the ohmic electrode (the drain electrode) on the N polarity plane side of the n-type aluminum nitride single crystal substrate.

EXAMPLE

Hereinbelow, the present invention will be described using the examples and the comparative examples, however the present invention is not to be limited thereto.

Example 1

For the aluminum nitride single crystal seed substrate for producing the n-type aluminum nitride single crystal substrate of the present invention, C-plane aluminum nitride single crystal seed substrate (☐15 mm×thickness 500 μm) was used. The dislocation density (the etch pit density) of this aluminum nitride single crystal seed substrate was $1 \times 10^4$ cm$^{-2}$. Note that, this dislocation density was obtained by the same method as the measuring method of the dislocation density of the n-type aluminum nitride single crystal substrate as described in the following.

After this seed substrate was placed on the susceptor made of pyrolytic boron nitride of the HVPE reactor, the pressure in the HVPE reactor was set to 750 Torr, then the seed substrate was heated to 1450° C. under the mixed carrier gas of hydrogen and nitrogen atmosphere. Here, the ammonia gas was supplied so that it satisfies 0.5 vol % with respect to the entire carrier gas flow amount (10 slm). Next, the aluminum chloride gas, which is obtained by the reaction between aluminum metal heated to 450° C. and hydrogen chloride gas, was supplied so that it satisfies 0.05 vol % with respect to the entire carrier gas supplied amount. Thereby, 300 μm thick the n-type aluminum nitride single crystal layer was formed on the seed substrate. At this time, a quartz fragment (☐3 mm×the thickness of 1 mm) was placed on the susceptor, thereby Si was doped in the aluminum nitride single crystal layer by using the natural decomposition phenomenon of the quartz which occurs during the growth.

After the laminated substrate formed with the n-type aluminum nitride single crystal layer was taken out from the HVPE reactor, the X ray rocking curve measurement for (002) and (101) reflection of the n-type aluminum nitride single crystal layer were carried out under the condition of the accelerated voltage of 45 kV and the accelerated current of 40 mA by using the high resolution X ray diffraction device (X 'Part made by Spectris componay PANalytical B.V.). The full widths half maximum values of the X ray rocking curve were 22 and 15 arcsec, respectively.

Then, the N polarity plane of the n-type aluminum nitride single crystal layer grown by HVPE was exposed by removing the aluminum nitride single crystal seed substrate portion by the mechanical polishing. Next, the growth surface (the Al polarity plane) was smoothed by chemical-mechanical polishing (CMP). The thickness of the n-type aluminum nitride single crystal substrate obtained as such was 150 μm.

Then, the obtained n-type aluminum nitride single crystal substrate was cut into a square shape of 5 mm square or so (four n-type aluminum nitride single crystal substrates having a square shape of 5 mm square or so were made).

For one of the substrate of after the cut, by SIMS using cesium ion as the primary ion, the quantitative analysis of Si and carbon were carried out from the both plane sides of the Al polarity plane and the N polarity plane. The concentration was quantified based on the nitrogen secondary ion intensity of the aluminum nitride standard sample. The Si concentration was $3 \times 10^{17}$ cm$^{-3}$ for both sides of the Al polarity plane and the N polarity plane. Also, the carbon concentration was $1 \times 10^{17}$ cm$^{-3}$ (the detection lower limit of the measurement being carried out) as well. Further, the same substrate was immersed for 5 min in the mixed solution of potassium hydroxide and sodium hydroxide at 300° C., and then using differential interference microscope, arbitrary 10 vision fields were observed within the vision range of 100 μm square, thereby the etch pit density (the dislocation density) was observed. The calculated etch pit density (the dislocation density) was $2 \times 10^5$ cm$^{-2}$.

For other three substrates, the surface was cleaned in the hydrochloric acid heated at 40° C. Then, using one of the substrate thereof, Ti (20 nm)/Al (100 nm)/Ti (20 nm)/Au (50 nm) electrode was formed on the entire plane of the Al polarity surface as the ohmic electrode layer by the vacuum evaporation; and then the heat treatment was carried out at 1000° C. in the nitrogen atmosphere. Then, the protective film was formed by coating the resist on the electrode forming planes, and again the surface was cleaned in the hydrochloric acid heated at 40° C. Next, Ni (20 nm)/Au (50 nm) electrode of 300 μm was formed on the N polarity plane side of the obtained substrate as the Schottky electrode. The resist was released by immersing the substrate formed with the electrodes in acetone; thereby the vertical Schottky barrier diode using the n-type aluminum nitride single crystal substrate was made.

Figure 6:
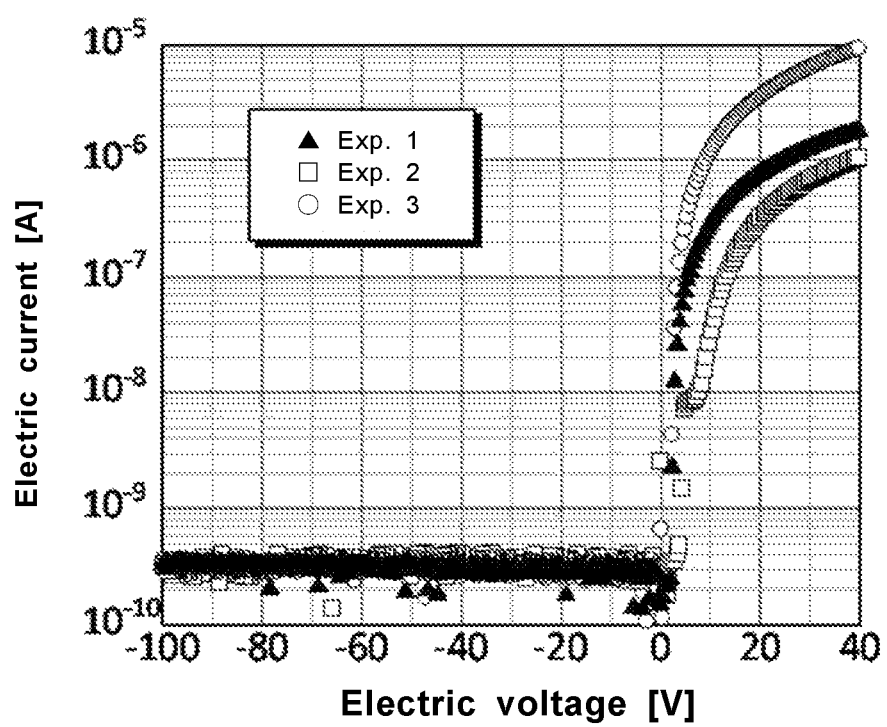
FIG. 6 is a diagram showing the electric current—electric voltage characteristic of the vertical Schottky barrier diode produced in the present example.

FIG. 6 shows the electric current—electric voltage characteristic between the Schottky electrode layer and the ohmic electrode layer of the obtained vertical Schottky barrier diode. The Schottky diode characteristic with turn on voltage of 3 V was observed. Also, the electrical current was $5 \times 10^{-7}$ Acm$^{-2}$ when the reverse voltage was 100 V.

Example 2

The vertical Schottky barrier diode was produced and the evaluation was carried out as same as the example 1 by using one of other substrates of which the surface was washed in the hydrochloric acid heated to 40° C. in the example 1; except that the ohmic electrode layer was formed on the N polarity plane side and the Schottky electrode layer was formed on the Al polarity plane. The electrical current—electrical voltage characteristic is shown in FIG. 6. The Schottky diode characteristic with turn on voltage of 10 V or so was obtained. Also, as similar to the example 1, the electrical current was $5 \times 10^{-7}$ Acm$^{-2}$ when the reverse voltage was 100 V.

Example 3

The vertical Schottky barrier diode was produced and the evaluation was carried out as same as the example 1 by using one of other substrates of which the surface was washed in the hydrochloric acid heated to 40° C. in the example 1; except that 30 nm thick n-type $Al_{0.7}Ga_{0.3}N$ layer was grown on the Al polarity plane side of the substrate by MOVPE at 1080° C., and the ohmic electrode layer was formed at the Al polarity plane side of the n-type $Al_{0.7}Ga_{0.3}N$ layer and the Schottky electrode layer was formed at the N-polarity plane side of the substrate. Note that, Si concentration in n-type $Al_{0.7}Ga_{0.3}N$ layer measured by SIMS analysis was $1 \times 10^{19}$ cm$^{-3}$. The electrical current—electrical voltage characteristic is shown in FIG. 6. The Schottky barrier diode characteristic with turn on voltage of 3 V or so was obtained. Also, as similar to the example 1, the electrical current was $5 \times 10^{-7}$ Acm$^{-2}$ when the reverse voltage was 100 V.

Comparative Example 1

The aluminum nitride freestanding substrate which becomes the seed substrate was produced by the method disclosed in the example 3 of the patent document 6. The etch pit density (the dislocation density) of the obtained freestanding substrate was $2 \times 10^6$ cm$^{-2}$. 300 µm thick n-type aluminum nitride single crystal layer was formed as same as the example 1 except for using this freestanding substrate as the seed substrate and grown at 1300° C. The cracks were generated in the n-type aluminum nitride single crystal layer taken out from the reactor, and the Schottky barrier diode was unable to be formed.

REFERENCES OF THE NUMERALS

1 N-type aluminum nitride single crystal substrate
1a N polarity plane
1b Al polarity plane
2 Schottky electrode layer (electrode layer)
3 Ohmic electrode layer (electrode layer)
4 N-type AlXGa1-XN layer
5 Aluminum nitride single crystal seed substrate
1' N-type aluminum nitride single crystal layer

The invention claimed is:

1. A laminated body stacked with a layer represented by Al$_x$Ga$_{1-x}$N, wherein X is a rational number satisfying $0.3 \leq X \leq 0.8$ and having a Si content of $1 \times 10^{18}$ to $5 \times 10^{19}$ cm$^{-3}$, on at least one principal plane of an n-type aluminum nitride single crystal substrate, wherein said n-type aluminum nitride single crystal substrate has an Si content of $3 \times 10^{17}$ to $1 \times 10^{20}$ cm$^{-3}$, a dislocation density of $10^6$ cm$^{-2}$ or less, and a thickness of 50 to 500 µm.

2. A vertical nitride semiconductor device comprising electrode layers on top and bottom of principal planes of the layered body as set forth in claim 1.

3. The vertical nitride semiconductor device as set forth in claim 2 wherein one electrode layer on the layer represented by Al$_x$Ga$_{1-x}$N, wherein X is a rational number satisfying $0.3 \leq X \leq 0.8$ is an ohmic electrode layer.

4. A vertical Schottky barrier diode wherein one electrode layer on the n-type aluminum nitride single crystal substrate in the vertical nitride semiconductor device as set forth in claim 3 is a Schottky electrode layer.

5. The vertical Schottky barrier diode as set forth in claim 4 wherein an electric current density is $10^{-6}$ Acm$^{-2}$ or less when a reverse voltage is 100V.

6. The laminated body of claim 1 wherein the dislocation density of the n-type aluminum nitride single crystal substrate is $10^2$ cm$^{-2}$ to $10^4$ cm$^{-2}$.

7. The laminated body of claim 1 wherein the Si content of the n-type aluminum nitride single crystal substrate is $5 \times 10^{19}$ to $1 \times 10^{20}$ cm$^{-3}$.

8. A vertical nitride semiconductor device comprising:
the laminated body as set forth in claim 1;
an ohmic electrode layer comprising Ti or Al on the layer represented by Al$_x$Ga$_{1-x}$N wherein X is a rational number satisfying $0.3 \leq X \leq 0.8$; and
a Schottky electrode layer comprising Ni, Pt, or Pd on the principal plane side of said n-type aluminum nitride single crystal substrate.

* * * * *